United States Patent [19]
Hoffmann et al.

[11] Patent Number: 5,163,235
[45] Date of Patent: Nov. 17, 1992

[54] APPARATUS FOR WASHING OUT PHOTOPOLYMER PRINTING PLATES BY MEANS OF SOLVENTS, DRYING THE PRINTING PLATES AND RECOVERING THE SOLVENTS

[75] Inventors: Horst Hoffmann, Bad Durkheim; Norbert Holl, Battenberg; Rolf Schwan, Nastaetten, all of Fed. Rep. of Germany

[73] Assignee: BASF Aktiengesellschaft, Ludwigshafen, Fed. Rep. of Germany

[21] Appl. No.: 671,744

[22] PCT Filed: Oct. 28, 1989

[86] PCT No.: PCT/EP89/01288
§ 371 Date: May 3, 1991
§ 102(e) Date: May 3, 1991

[87] PCT Pub. No.: WO90/05065
PCT Pub. Date: May 17, 1990

[30] Foreign Application Priority Data
Nov. 5, 1988 [DE] Fed. Rep. of Germany ....... 3837648

[51] Int. Cl.⁵ .............................................. F26B 21/06
[52] U.S. Cl. .......................................... 34/60; 34/73; 34/76; 34/242; 34/92; 134/109
[58] Field of Search ................... 34/73, 74, 76, 77, 78, 34/79, 68, 69, 17, 18, 92, 60, 242; 134/109, 105, 200, 63, 61

[56] References Cited
FOREIGN PATENT DOCUMENTS
1126891 11/1959 Fed. Rep. of Germany ......... 34/73
2606079 8/1977 Fed. Rep. of Germany ......... 34/73
3503974 8/1986 Fed. Rep. of Germany ......... 34/73

*Primary Examiner*—Henry Bennett
*Attorney, Agent, or Firm*—Keil & Weinkauf

[57] ABSTRACT

An apparatus for washing out photopolymer printing plates by means of solvents, drying the printing plates and recovering the solvents, a conventional washout station and a conventional drying station being connected to a solvent recovery means integrated in the drying station, which consists of the following parts:
  a hermetically sealing drying chamber for the printing plates, having an adjustable hood (15) and stationary panel (16), with panel heaters (18a, 18b) inserted in the hood and panel,
  a system which is connected to the interior space formed when the drying chamber is closed and which consists of a heat exchanger (25) for cooling the solvent vapor/air mixture, formed by drying the printing plates in the drying chamber, and condensation of the solvents,
  a solvent separator (26) for separating off the liquefied solvents,
  a vacuum pump (27) and a buffer vessel (33) for sucking up the solvent vapor/air mixture and compressing the solvent vapor/air mixture,
  a heat exchanger (28) for increasing the temperature of the air circulating in the system, two three-way valves (31, 32) and connecting pipelines from the drying chamber via the individual units and back to the drying chamber.

3 Claims, 3 Drawing Sheets

APPARATUS FOR WASHING OUT PHOTOPOLYMER PRINTING PLATES BY MEANS OF SOLVENTS, DRYING THE PRINTING PLATES AND RECOVERING THE SOLVENTS

The present invention relates to an apparatus for washing out photopolymer printing plates by means of solvents, drying the printing plates and recovering the solvents using a conventional washout station and a conventional drying station having an apparatus for recovering the solvents, consisting of a drying chamber for the printing plates, having an adjustable hood and stationary panel.

The apparatus described above is used predominantly for recovering solvents which are used for washing out photopolymer printing plates (referred to below as printing plates) using known processing apparatuses, for example combined washers and driers. The solvents used are predominantly mixtures of chlorinated hydrocarbons (referred to below as hydrocarbons) and alcohols. These solvents are present in intermolecular form or as surface moisture during washing out of the printing plates and as readily volatile vapors during drying.

In the prior art, the solvent-containing vapors obtained during drying of the printing plates are passed directly from the combined apparatuses through pipelines into the atmosphere, without subjecting these vapors beforehand to a waste air treatment.

According to the new West German Clean Air Act of Feb. 1986, this procedure will no longer be possible after a transition period to 1991; the waste air containing the readily volatile hydrocarbons may no longer be passed into the atmosphere.

Attempts are currently being made to recover the hydrocarbons by means of a waste air treatment plant. Such a plant is familiar in process engineering. There, the waste air enriched with solvent vapor is passed through a layer of an absorbent (active carbon or a molecular sieve). This solvent is in the form of layer is bound by the adsorbent, so that solvent-free, treated waste air leaves the adsorbent layer and passes into the atmosphere.

However, this procedure requires very expensive apparatus since the adsorbent, which becomes saturated after a certain adsorption time, must be desorbed using hot air. This is circulated, ie. after passing the adsorbent the air is cooled until the solvent condenses and can be separated off; the air is reheated and is passed through the adsorbent layer. After the desorption step, the adsorbent layer has to be cooled again with cool air. Since the heat capacity of the apparatus, the pipes and the adsorbent is relatively large and air is a poor heat-transfer medium, the process is very energy-consumptive and time-consuming.

Furthermore, DE-A-3 503 974 describes an apparatus for washing out and drying plates in a continuous procedure. The objects of this apparatus is to ensure better washout of these plates and at the same time to increase the throughput speed.

These processes are thereof unsuitable for solving the problem encountered.

It is an object of the present invention to combine the processing apparatuses in which solvent vapors are formed, ie. the washer and dryer, into a closed system without exit of waste air, the said system having only one sealable input slot for the exposed printing plate still to be washed out and a sealable output apparatus from which the ready, dried printing plate is removed.

DETAILED DESCRIPTION OF THE INVENTION

Figure 1:
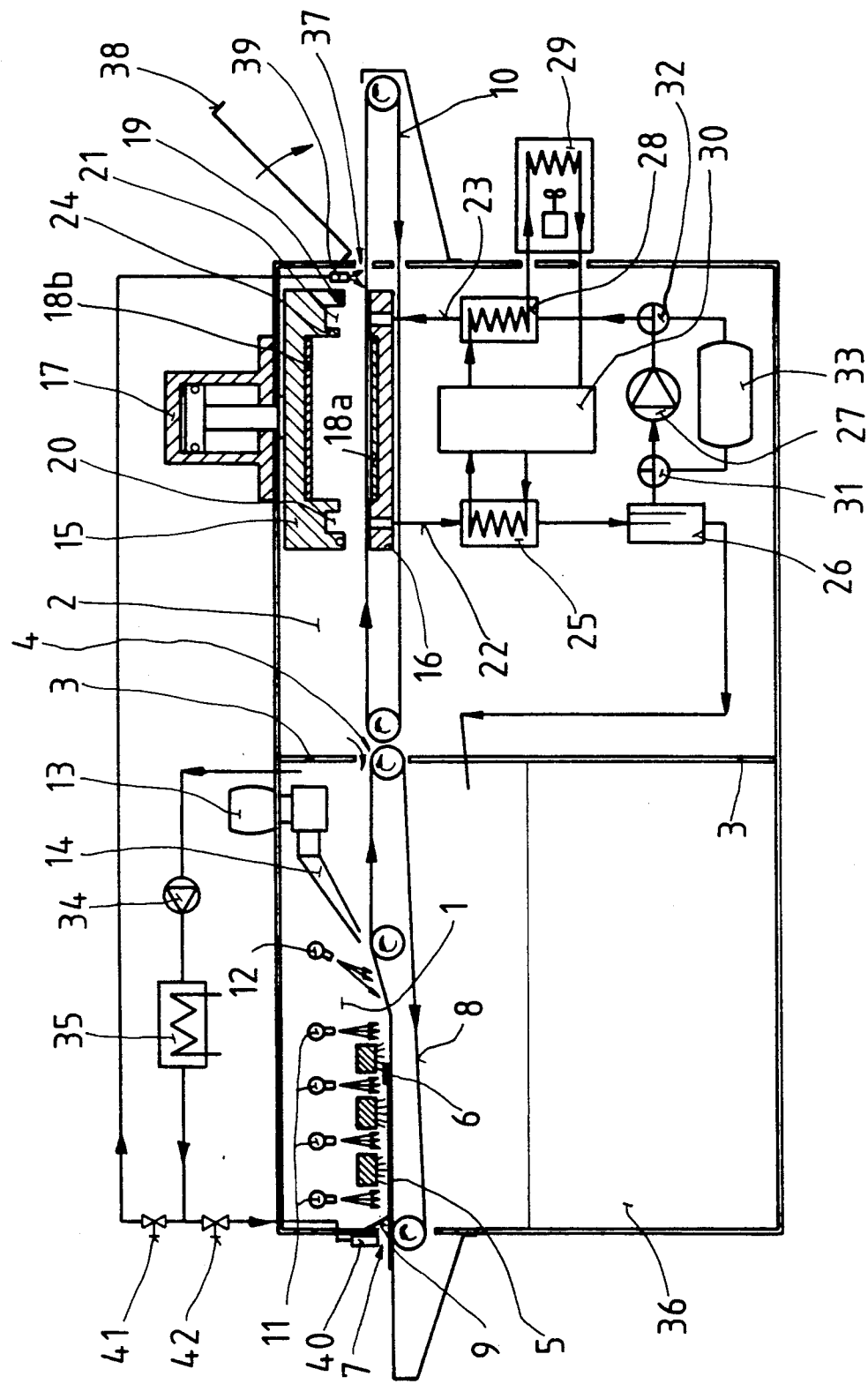
FIG. 1 shows a schematic structure of the photopolymer printing plate wash out apparatus.

We have found that this object is achieved, according to the invention, by the defining clause of claim 1.

Further features of the novel apparatus are described in the subclaims.

An embodiment of the invention having the essential inventive features is shown in the drawing and is described in detail below with reference to various FIGS.

FIG. 1 shows a schematic structure of the apparatus.

The compact apparatus is divided into a conventional washout station 1 and the novel drying station 2, having the integrated means for solvent recovery, by a bulkhead partition 3 which has only one slot 4 to allow the washed out printing plate 5 to pass.

The previously exposed printing plate is connected in a conventional manner to the driver bar 6 and suspended at the intake slot 7 in the two revolving transport chains 8. The transport chains move parallel at a distance apart corresponding to the driver bar, on both sides of the washout area. To prevent solvent vapors escaping from the intake slot, a flexible, thin antiadhesive apron 9 made of glass fiber-reinforced teflon cloth of excessive length is mounted so that it either slides on the printing plate or rests on the plate table. The arrangement of the plate table, which is not shown for the sake of clarity, corresponds to the path of the transport chains 8 and 10.

The printing plate 5 is thus drawing continuously through the washout station and is first treated with spent solvent, which is sprayed through the nozzles 11, and then with fresh solvent from the nozzles 12. To improve the subsequent washing effect, the printing plate is transported obliquely upward in the region of the nozzles 12. By means of a fan 13 and a slot nozzle 14, the solvent is blown as completely as possible out of the indentations in the printing plate relief. The extracted air originates from the washout stations; it is thus virtually saturated with solvent vapor and circulates internally.

The distance from the slot nozzle to the slot 4 in the bulkhead partition corresponds to the greatest possible printing plate length. When the driver bar passes through the slot, the printing plate is transferred to a second pair of transport chains 10 and moved at high speed into the drying chamber, which si formed by the upper flat hood 15 and the lower stationary panel 16.

Instead of the second pair of chains 10, transport of the printing plate and loading of the drying chamber could be effected using a double fork which moves in a linear manner and grips the two ends of the driver bar 6.

The hood can be raised or lowered by the lifting means 17. The drying chamber consists of a hood and a panel, each of which has a panel heater 18a or 18b, which corresponds to the dimensions of the largest possible printing plate. The lower heater 18a i sunk flush in the panel 16.

The hood 15 has a peripheral seal 19, which ensures a hermetic seal in the closed, ie. lowered, state. Furthermore, the frame of the hood is designed so that two distribution channels 20 and 21 are formed in the closed state, the said channels each being connected via a gap to the interior of the chamber. The gaps occur between the shortened inner walls 24 of the panel and the panel 16. In the closed state, the lines 22 and 23 are thus connected to the interior of the chamber via the distribution channels 20 and 21 and via the two gaps.

The line 22 leads from the drying chamber to the heat exchanger 25, solvent separator 26, vacuum pump 27 and heat exchanger 28, and via line 23 to the distribution channels 21, and back to the drying chamber via the gap.

The heat exchangers 25, 28 and 29 are part of the heat pump 30:

The heat removed from the heat exchanger 25 and the power of the refrigeration unit of the heat pump 30 are mainly fed to the heat exchanger 28.

The residual heat in the refrigerant circulation is released in heat exchanger 29.

The three-way valves 31 and 32 in conjunction with the buffer vessel 33 permit the following possibilities for drying the printing plate.

Figure 2:
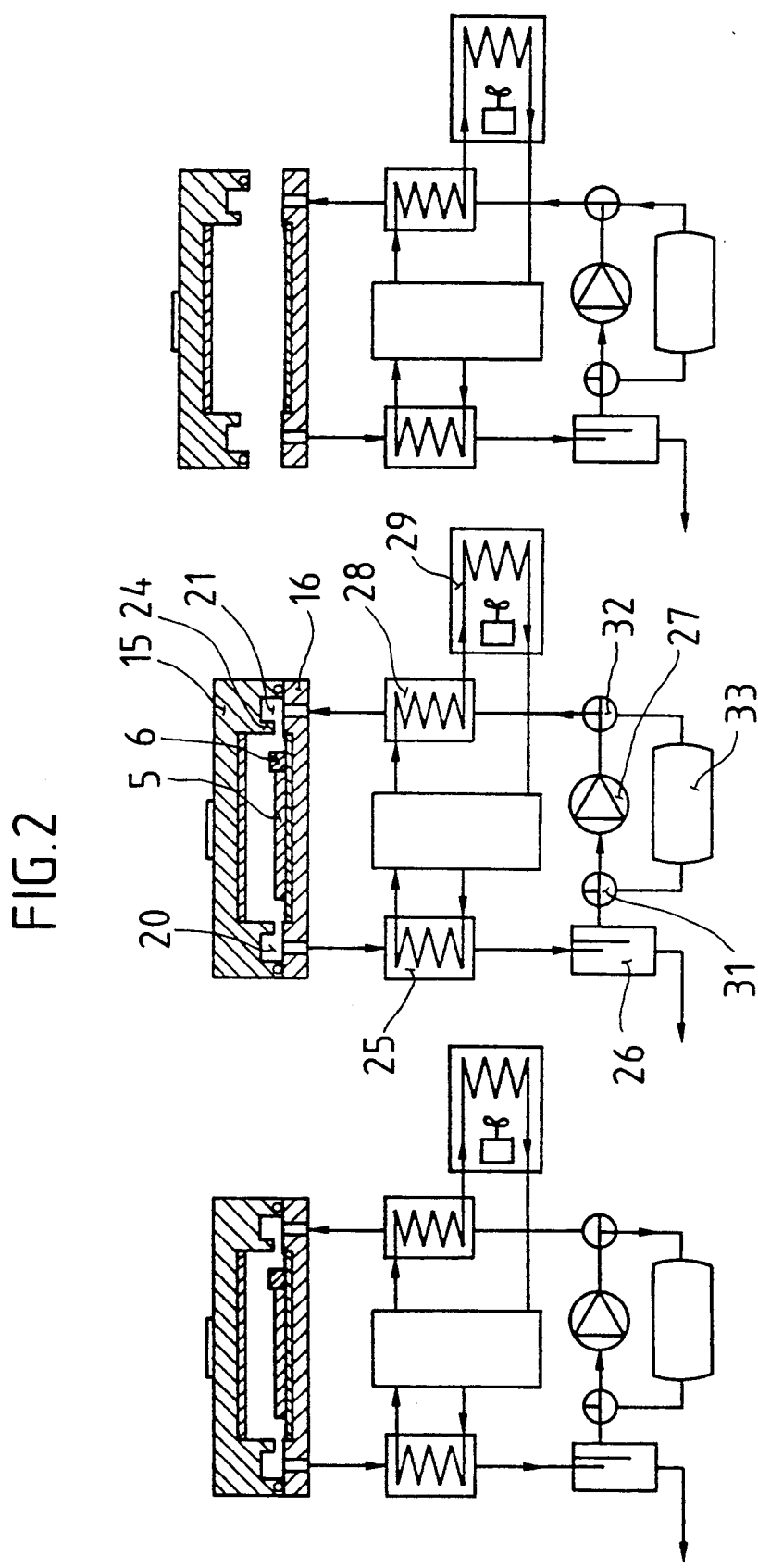
FIG. 2 shows the positioning of the apparatus elements at different points in time during a process for using the apparatus.

FIG. 2 shows a possible procedure.

The procedure described below is preferable for sensitive printing plates which tend to form bubbles at the relief surface below a certain reduced pressure. This type of drying also functions in a normal atmosphere.

After the printing plate 5 to be dried has been automatically inserted into the preheated drying chamber 15/16 with the aid of the driver bar 6 and the said chamber has been sealed, the vacuum pump 27 begins to reduce the pressure partially in the entire drying chamber and pipe system. The three-way valve 31 is switched so that the air sucked in is compressed in buffer vessel 33.

The three-way valve 32 is then switched to that the air is circulated via the closed drying chamber with the aid of the vacuum pump 27.

The solvent vapor/air mixture sucked out of the drying chamber first passes into the heat exchanger 25, in which the solvent vapor is virtually completely liquefied by removal of heat.

The solvent separated in the downstream separator 26 is transported to the washout station 1 for reuse, while the cooled air passes through the vacuum pump 27, the two valves 31 and 32 and the heat exchanger 28, in which the air is reheated before it is fed again to the drying chamber.

The drying effect is thus based not so much on the boiling point of the solvent, which is depressed due to the reduced pressure, as on the ability of the air to take up the solvent as a function of temperature.

Intensive and very uniform flow around the printing plate 5 is therefore of great importance, this being achieved by means of the distribution channels 20 and 21 and the gaps formed by the inner walls 24 and the panel 16. Considered in the opposite way, if there were no exchange of air at a point in the drying chamber, the printing plate could not give up any solvent to the stationary saturated air at that point. For this reason, it has been possible to achieve somewhat shorter drying times in an experiment with a metal fabric between the heating panel 18a and the printing plate 5.

The following optimum values for a sensitive multilayer plate having a length of 750 mm, a width of 450 mm, a total thickness of 2.75 mm and a relief height of 0.7 mm have been determined by experiments:

| | |
|---|---|
| Drying chamber temperature: | 60–65° C. |
| Drying chamber pressure: | 800–900 mbar |
| Temperature in heat exchanger (25) | −15° C. |
| Temperature in heat exchanger (28) | +70° C. |
| Mean flow rate in the drying chamber: | 0.1 m/s |
| Solvent used | 89% by weight of Per 11% by weight of butanol |
| Solvent absorption: | at 60° C. 750 g/m$^3$ of air at −15° C. 18 g/m$^3$ of air |
| Drying time: | 14 min |
| Residual solvent content: (determined by subsequent drying in a heating oven) | 13 g |

Figure 3:
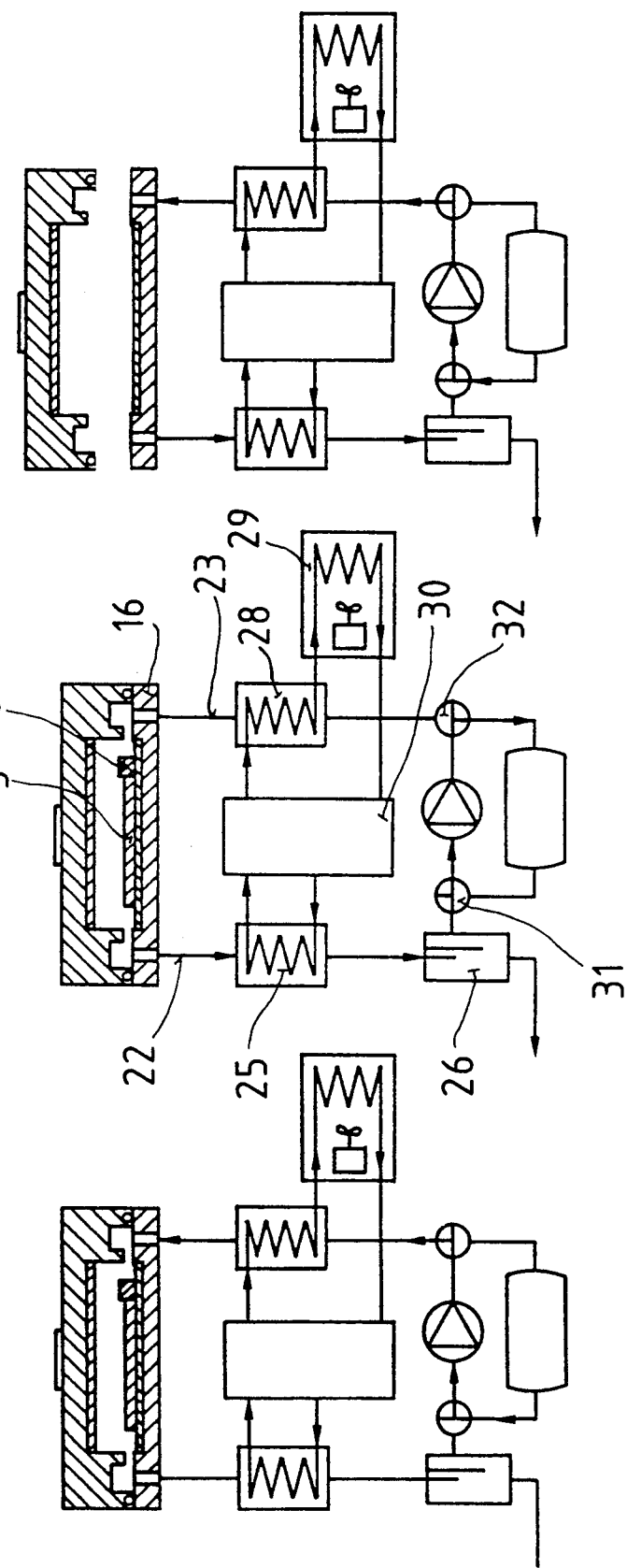
FIG. 3 shows the positioning of the apparatus elements at different points in time during an alternative process for using the apparatus.

FIG. 3 shows an alternative procedure.

This procedure is suitable predominantly for single-layer printing plates in which reduced pressure does not cause any reduction in quality.

In order to avoid having to give the buffer vessel 33 unnecessarily large dimensions at the relatively low pressures desired, the buffer vessel is preevacuated with the hood 15 raised. The hood is then lowered, ie. hermetically sealed. During the drying time, the vacuum pump 27 delivers into the buffer vessel 33. As in the procedure shown in FIG. 2, the solvent vapors are limited in the heat exchanger 25 by removal of heat, and the liquid solvent is fed via the separator 26 to the solvent container 36.

The quantity of heat removed by the heat pump 30 is released into the atmosphere exclusively via the heat exchanger 29.

Air circulation is dispensed with. All that is important is that the heat required for evaporating the solvent is supplied uniformly to the printing plate 5 to be dried, in the required time, partly by heat conduction by the panel heater 18a and partly by heat radiation by the panel heater 18b.

The following have proven optimum values for a single-layer plate having a length of 750 mm, a width of 450 mm, a total thickness of 2.84 mm and a relief height of 1.2 mm;

| | |
|---|---|
| Drying chamber temperature: top bottom | 60–65° C. about 120° C. (radiant heat) |
| Drying chamber pressure: | 20–50 mbar |
| Boiling point at this pressure: | 22–40° C. |
| Temperature in heat exchanger (25): | −20° C. |
| Solvent used: | 89% by weight of Per 11% by weight of butanol |
| Drying time: | 10 min |
| Residual solvent content: | 11 g |

The advantages obtained with the invention primarily relate to occupational safety, since the operator of the processing apparatuses virtually no longer comes into contact with the solvent. In the past, he was exposed to the solvent vapors, considered physiologically unacceptable, during transport of the printing plates from the washout apparatus to the drying oven and during operation of the drying oven.

The same applies to environmental protection: the solvent emission is negligibly small and is well below the limits set by the new West German Clean Air Act.

Furthermore, the production time for the printing plate is substantially reduced since the hour-long drying in the heating oven is dispensed with.

Compared with the alternatives undergoing trials (active carbon or molecular sieve), the novel apparatus entails substantially lower capital costs and operating costs.

The drying station of the novel apparatus is also suitable as a separate apparatus for replacing the heating oven as a temporary compromise in existing plants, so that, in conjunction with changes to the continuous washers on the market, emission values which meet the legal requirements are achieved.

We claim:

1. Apparatus for washing out photopolymer printing plates by means of solvents, drying the printing plates and recovering the solvents, which comprises a conventional washout station and a conventional drying station having an apparatus, integrated in the drying station, for recovering the solvents, consisting of a hermetically sealing drying chamber for the printing plates, having an adjustable hood (15) and stationary panel (16), with panel heaters (18a, 18b) inserted in the hood and panel, a system which is connected to the interior space formed when the drying chamber is closed and which consists of a heat exchanger (25) for cooling the solvent vapor-/air mixture, formed by drying the printing plates in the drying chamber, and condensation of the solvents, a solvent separator (26) for separating off the liquefied solvents, a vacuum pump (27) and a buffer vessel (33) for sucking up the solvent vapor-/air mixture and compressing the solvent vapor/air mixture, a heat exchanger (28) for increasing the temperature of the air circulating in the system, the system being interconnected by pipelines connecting the drying chamber to the heat exchanger (25), the heat exchanger (25) to the solvent separator (26), the solvent separator, via a three-way valve (31), to the vacuum pump (27) and buffer vessel (33), the vacuum pump (27), via a second three-way valve (32), to the buffer vessel (33) and the heat exchanger (28) and the heat exchanger (28) to the drying chamber.

2. Apparatus as claimed in claim 1, wherein the heat exchangers (25, 28 and 29) are integrated in a heat pump (30).

3. Apparatus as claimed in claim 1, wherein the washout station (1) and the drying station (2) are combined to form one unit.

* * * * *

UNITED STATES PATENT AND TRADEMARK OFFICE
CERTIFICATE OF CORRECTION

PATENT NO. : 5,163,235

DATED : NOV. 17, 1992

INVENTOR(S) : HOFFMANN et al.

It is certified that error appears in the above-identified patent and that said Letters Patent is hereby corrected as shown below:

In claim 1, column 6, line 9:

"liquefied" should read --liquified--

Signed and Sealed this

Ninth Day of November, 1993

*Attest:*

BRUCE LEHMAN

*Attesting Officer*      *Commissioner of Patents and Trademarks*